United States Patent [19]

Camlibel et al.

[11] 4,374,391

[45] Feb. 15, 1983

[54] DEVICE FABRICATION PROCEDURE

[75] Inventors: Irfan Camlibel, Stirling; Shobha Singh, Summit; LeGrand G. Van Uitert, Morristown, all of N.J.

[73] Assignee: Bell Telephone Laboratories, Incorporated, Murray Hill, N.J.

[21] Appl. No.: 190,342

[22] Filed: Sep. 24, 1980

[51] Int. Cl.$^3$ ............................ C23C 15/00; H01L 31/00
[52] U.S. Cl. .................................. 357/17; 204/192 D; 357/30; 357/73; 428/428; 428/432; 501/54; 501/65
[58] Field of Search ...................... 204/192 D; 106/54; 357/73, 30, 17; 428/428, 432

[56] References Cited

U.S. PATENT DOCUMENTS

| | | | |
|---|---|---|---|
| 3,471,396 | 10/1969 | Davidse | 204/298 |
| 3,505,106 | 4/1970 | Pliskin et al. | 357/52 |
| 3,507,766 | 4/1970 | Cunningham et al. | 204/192 |

OTHER PUBLICATIONS

L. G. Van Uitert et al., "Borosilicate Glasses for Fiber Optical Waveguides", *Mat. Res. Bull.*, vol. 8, pp. 469-476, (1973).
S. H. Wemple et al., "Binary $SiO_2-B_2O_3$ Glass Systems", *J. Appl. Phys.*, vol. 44, pp. 5432-5437, (1973).
G. Brackley et al., "Integral Covers for Silicon Solar Cells", *Conf. Record, 9th IEEE Photovoltaic Specialists Conf.*, (1972), pp. 174-178.
R. L. Crabb et al., "Evaluation of European Integral Solar Cell Covers Deposited by R. F. Sputtering", *Conf. Record, 12th IEEE Photovoltaic Specialists Conf.*, (1976), pp. 577-586.

*Primary Examiner*—Aaron Weisstuch
*Attorney, Agent, or Firm*—Walter G. Nilsen

[57] ABSTRACT

A fabrication technique is described for making various devices in which a type of glass is used as a surface protection layer. The glass layers are put down by particle bombardment (generally sputtering) of a borosilicate glass target. Devices with such surface layers are also described. Such glass layers are highly advantageous as encapsulating material, diffusion barrier layers, etc., particularly for optical type devices and certain semiconductor devices. Particularly important is the preparation procedure for the glass target used in the bombardment process. The glass layers are moisture stable, act as excellent barriers against diffusion, and are usable up to quite high temperatures without cracking or peeling. The glass layers also provide long-term protection against atmosphere components including water vapor, oxygen, atmosphere pollution contaminants, etc.

36 Claims, 5 Drawing Figures

DEVICE FABRICATION PROCEDURE

TECHNICAL FIELD

The invention involves the use of certain glasses in the fabrication of certain devices and the use of certain glasses in the structure of these devices.

BACKGROUND OF THE INVENTION

The fabrication of some devices often requires protective layers for surface protection and pattern delineation. Such surface layers are useful during fabrication as well as on completed devices. Requirements for such films differ widely depending on the particular fabrication procedure, material, etc. Usually, adherence, stability, (particularly toward moisture), and effectiveness as a diffusion barrier are of principal importance. Also, stability, adherence, etc., at high temperatures are desirable where high temperatures are used during fabrication of the device or on subsequent use of the device. In addition, with some applications and fabrication procedures, it might be advantageous for the protective layer to be at least partially transparent to radiation including radiation in the infrared, visible, ultraviolet, X-ray and gamma ray regions.

Optical devices are becoming of increasing importance principally because of the development of optical communications systems and certain types of display systems. Because of these developments, various optical devices including semiconductor optical devices are becoming increasingly important so that economic and effective techniques for manufacturing such devices are in great demand. Coatings that are suitable for use on optical devices including semiconductor optical devices are highly desirable. Such coatings should be stable, unaffected by ordinary atmosphere substances such as moisture, chemicals, etc., adherent and be able to withstand temperatures used to fabricate the devices or in the use of the devices. In many devices, the coating should also be transparent at various parts of the radiation spectrum. Where the coating is used to encapsulate optical devices, it should be transparent to the part of the radiation spectrum where they operate. Exemplary optical devices are light emitting diodes, lasers and optical detectors. The coatings may also be used as reflection coatings to increase or decrease reflection of radiation on the surface of a semiconductor optical device. Indeed, in a general sense, the thickness and optical properties of a glass layer can be adjusted to either increase transmission of the device (e.g., for light emitting diodes or optical detectors) or increase the reflectivity of the coatings (e.g., for laser applications, etc.).

It should be remarked that the term "optical" is used in a broad sense and is not limited to only visible radiation. The term optical radiation refers to any useful radiation and includes infrared radiation, ultraviolet radiation, X-ray and gamma ray radiation, etc.

In the fabrication of some devices it is advantageous to have protective layers that are transparent to radiation. For example, it might be advantageous to observe the surface under the protective layer during processing or at various steps during the processing.

Typical semiconductor optical devices have been described in a variety of references including *Light Emitting Diodes* by A. A. Bergh and P. J. Dean, Clarenden Press, 1976 and *Injection Electroluminescent Devices* by C. H. Gooch, John Wiley and Sons, New York, 1973; and *Semiconductors and Semimetals*, edited by R. K. Willardson and A. C. Beer, Academic Press, 1966, Vol. 2; *Physics of III–V Compounds*. Such devices include semiconductor lasers, opto-isolators, light emitting diodes, light detectors, solar cells, etc.

A particularly rapid development has been occurring in the last few years in semiconductor optical devices. Much of this development is related to improving lifetime performance of semiconductor lasers and related semiconductor optical devices. Other developments are related to the extension of interest toward lower optical frequencies (principally in the infrared region) where some optical systems (i.e., optical communication systems) exhibit superior performance. Also, a greater variety of materials are being considered for these devices so as to improve performance. Often, these materials require surface protection either during fabrication of the device or when the completed device is being used.

Sample preparation of borosilicate glasses have been described previously (see S. H. Wemple et al, *Journal of Applied Physics* 44, 5432 (1973) and L. G. Van Uitert et al, *Material Research Bulletin*, 8 469–476 (1973)). In particular, these references disclose sample preparation for glasses used for fiber optical waveguides. Some bulk properties (i.e., index of refraction, etc.) of the borosilicate glass as a function of composition are disclosed in these references.

SUMMARY OF THE INVENTION

The invention is a process for making semiconductor devices in which sputtered borosilicate glass is used as a surface protection layer during at least part of the process. The glass should preferably contain at least 5 mole percent $B_2O_3$ and at least 5 mole percent $SiO_2$. An important aspect of the invention is the preparation of the borosilicate glass target material. The object of the preparation procedure is to ensure uniformity of the glass and avoidance of regions with high concentrations of $SiO_2$ or $B_2O_3$. Borosilicate glass layers are used as an intermediate step during the fabrication procedure or at the end of the fabrication procedure (such as in encapsulation of the device). Also, the invention is directed to semiconductor devices with at least one surface comprising a sputtered borosilicate glass layer in which he borosilicate glass target material is prepared in such a way as to ensure uniformity of the glass. Because of the optical transmission properties of glass, the borosilicate is most advantageously used on optical devices, particularly optical semiconductor devices such as light emitting diodes, semiconductor lasers, optical detectors, etc. Further, the borosilicate glass is most chemically and thermally stable, particularly toward water, if the mole percent of $B_2O_3$ in the borosilicate glass $B_2O_3.SiO_2$ is less than 60. Even more preferred is a mole percent of $B_2O_3$ less than 45. Preferred semiconductor substances in general have thermal expansions ($\alpha_g$) from $3 \times 10^{-6}$ from $3 \times 10^{-6}$ per degrees C. to $6.0 \times 10^{-6}$ per degress C. Since this range of thermal expansions (near room temperature) corresponds to those for thermal expansions for highly stable borosilicate glasses; thermal expansion matching and consequent minimization of degradation due to strain may be achieved. Typical semiconductor substances include elements such as silicon and germanium and many III–V semiconductor compounds such as gallium phosphide, indium phosphide, indium gallium arsenide, indium antimonide, etc. Such covering glass layers in general are highly stable, act as excellent barriers, especially at high temperatures, are not affected by water, and adhere well to various surfaces. The borosilicate layers serve as effective diffusion barriers and encapsulating agents to temperatures well above 750 degrees C. They are commonly used between 600 and 750 degrees C. In addition, the films do not crack or peel when used at high temperatures. The use of borosilicate layers is especially advantageous for semiconductors, particularly III–V semiconductors. In the case of InP and related compounds such as InGaAs, InGaAsP, etc., the benefits of using transparent protective coatings that are stable in the 750 degrees C. region are great both during device fabrication and as a permanent protective coating.

DETAILED DESCRIPTION

Figure 1:
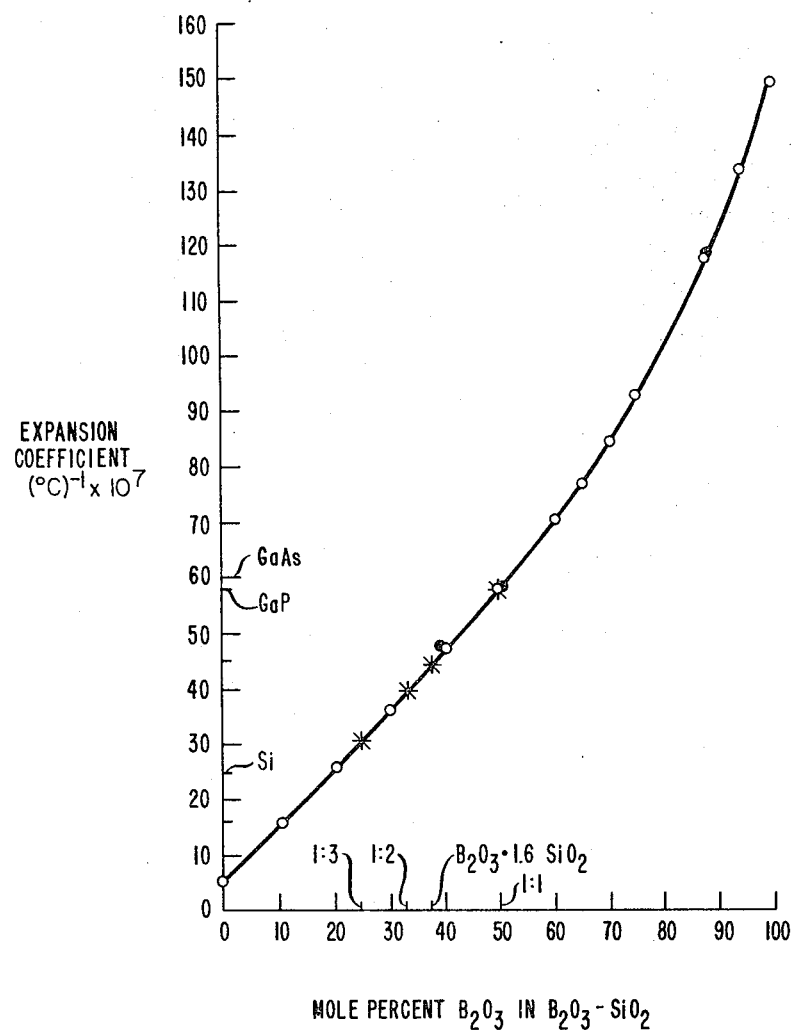
FIG. 1 shows a graph of the relationship between expansion coefficient of borosilicate glass vs. composition of the borosilicate glass.

The invention in its broadest terms is the use of sputtered borosilicate glass layers on the surface of materials used in various articles and devices. The borosilicate glass target material used in the sputtering procedure is prepared in a special way to ensure a uniform mix of $SiO_2$ and $B_2O_3$. The special procedure involves uniform mixing of $SiO_2$ and $B_2O_3$ with particle size less than 10 microns and then heat treatment at a temperature between 1500 and 2000 degrees C. for at least six hours. The glass layers may be used for final encapsulation, or in the fabrication process and removed or partially removed prior to completion of the device. The borosilicate layers may be used as diffusion barriers, insulatory layers and in a procedure for pattern delineation. Glass layers in the completed device are used in a variety of applications including encapsulation to protect surfaces against contamination and to alter radiation transmission for radiation-type devices. Such optical applications include reducing surface reflections in such devices as optical detectors, optical transmission devices, etc., and producing dielectric mirrors or reflectors for such devices as lasers, etc. A typical example is the use of the glass layers to reduce surface reflection on the surface of an optical detector. This increases the sensitivity of the detector by reducing reflections on the surface of the detector. Similarly, glass layers can be used on the surface of a light emitting diode to increase light output or alter the angular intensity distribution of the light output.

Particularly important in the practice of the invention is the preparation of the target material for the glass sputtering. It is highly advantageous to obtain highly uniform distribution of $B_2O_3$ and $SiO_2$ so as to minimize the number of boron-oxygen-boron bonds. Reduction of boron-oxygen-boron bonds is believed to have beneficial effects on the properties of the borosilicate glass, including resistance from attack by water and moisture. It is believed that sputtering removes chunks of glass (small in size by everyday standards but still very large by atomic standards) without altering the essential atomic structure of the glass. Thus, the atomic structure of the glass film and therefore the chemical and physical property of the borosilicate films depends on the atomic structure of the borosilicate glass target material used in the sputtering process.

The initial step is to measure out (usually by weighing) the amounts of $SiO_2$ and $B_2O_3$ desired in the borosilicate glass. Although ordinary purity (i.e., 99 wt. percent) is often satisfactory, for some applications extremely high purity (99.99 or even 99.999 weight percent) is preferred. The two substances are then mixed to make as uniform a mixture as possible. This can be done in a variety of ways including blowing, handmixing, etc., (see, for example, *Physical Ceramics for Engineers* by L. H. VanVlack, Addison-Wesley, 1964) but ball milling, usually for 5–15 hours with inert (i.e., plastic) jar and inert (i.e., corundum) balls is most convenient. Small particle size (preferably less than 10 or even less than one micron) is also advantageous to ensure uniform distribution of $B_2O_3$ and $SiO_2$. After mixing, the resulting powder is given a heat treatment. Essential to the heat treatment is a reaction procedure in the temperature range between 1500 and 2100 degrees C. (preferably 1600 to 1900 degrees C.) for at least six and preferably 12 hours. In practice, it is usually more convenient to carry out a sintering process (usually at 1000 to 1300 degrees C. for one to ten hours) first to reduce the volume of material and then carry out the higher temperature treatment at 1500–2100 degrees C. for at least six hours. For this high temperature heat treatment, it is convenient to use an r.f. furnace and an inert atmosphere such as ⅔ by volume nitrogen, ≈ argon. In addition, it is usually convenient to expose the resulting glass to an annealing procedure so as to be able to further process the glass (cut, grind, etc.) without cracking or shattering the glass. A typical annealing procedure is to heat the glass to within the temperature range from 600 to 1400 degrees C., depending on the boron content of the glass, for at least one hour and preferably up to 10 hours. More than about 10 hours is not usually necessary and wasteful of time.

Deposition of the film may be carried out in a variety of ways all of which involve bombardment of the glass target with various kinds of particles. Typical deposition procedures are sputtering and the E-beam deposition. These deposition procedures involve particle beams which remove clusters of atoms without disturbing the predominant atomic arrangement of the atoms in the glass.

Because of convenience and the ability to closely control the deposition process, it is preferred that the deposition be carried out by sputtering. Various sputtering procedures may be used but the procedure outlined by D. D. Davidse and L. I. Maissel in *Journal of Applied Physics* 37, 574 (1966) is most useful. An r.f. sputtering procedure is used. Generally argon is used as the sputtering gas with a trace of oxygen. Typical pressure is $1-10 \times 10^{-3}$ Torr and typical input power is 200–300 Watts.

The borosilicate glass is usable over a broad range of compositions. From a practical point of view most compounds where borosilicate films would be useful have expansion coefficients in the range where the mole percent of $B_2O_3$ in $SiO_2$ is less than 60 percent. For a mole percent $B_2O_3$ of less than 45, the stability of the borosilicate glass toward the effects of water is extremely good.

Further, for borosilicate glasses in the composition range below 30 mole percent $B_2O_3$, the glass remains hard enough to serve as an excellent diffusion barrier even up to 900 degrees C. Further, the glass acts as an excellent diffusion barrier for diffusing zinc into indium phosphide up to this temperature.

FIG. 1 shows a graph of thermal expansion coefficient of the borosilicate glass as a function of glass composition. Many substances of interest for use as glass layers have thermal expansion coefficients less than $6 \times 10^{-6}$ per degrees C. This corresponds to a composition of less than 50 mole percent $B_2O_3$. Typical substances are InP, CdS, CdTe, AlP, GaP, GaAs, Si, $Al_2O_3$, InGaAs, InGaAsP, $SiO_2$ and $Si_3N_4$. The circles on the graph represent measured expansion coefficients for the composition of the borosilicate glass shown on the graph and the crosses represent particular compositions labeled on the coordinate of the graph.

Preferred use of borosilicate glass is to protect InP, GaAs, InGaAs and InGaAsP because of the close match of expansion coefficient in the composition range of borosilicate glass that yields excellent films and the need to do processing steps (ion-implantation or diffusion) in the temperature range up to 750 degrees C. These films are particularly advantageous where diffusion is used (generally Cd or Zn for InP) since thermal activation of ion-implanted regions often require temperatures in the range from 550–750 degrees C.

Figure 2:
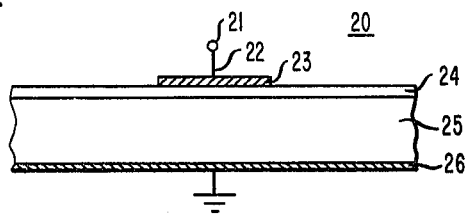
FIG. 2 shows an idealized structure for a metal-insulator-semiconductor structure.

The insulating properties of the borosilicate films can be used on a variety of electrical devices. A typical structure is the metal-insulator-semiconductor (MIS) structure shown in FIG. 2. The MIS structure 20 comprises means to apply electrical energy to a metal field plate 23 including electrical terminal 21 and conductor 22. The insulator 24 is made in accordance with the invention and comprises borosilicate glass. The composition of the borosilicate glass is preferably such that the expansion coefficient matches (at least within 30 percent) the expansion coefficient of the semiconductor 25 used. An ohmic contact 26 completes the circuit.

Figure 3:
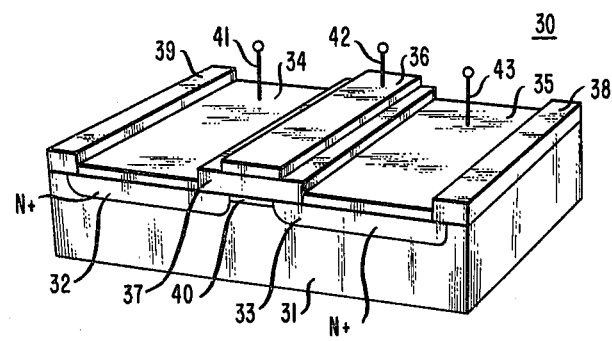
FIG. 3 shows a diagram of an insulated-gate field-effect transistor.

FIG. 3 is a diagram of a typical insulated-gate field-effect transistor 30. The device consists of a p-type semiconductor substrate 31 with two regions (source 32 and drain 33) of n+ material. Metal electrodes cover the source region 34 and the drain region 35. A metal electrode 36 called the gate electrode covers an insulating region 37 made in accordance with the invention. Other insulating regions may also be made of borosilicate glass. The narrow region below the gate insulator 37 is usually called the channel 40 or surface inversion layer. Electrical contacts include the source electrical contact 41, the gate electrical contact 40 and the drain electrical contact 43. Insulating material 38 is located adjacent to the drain contact 43 and insulating material 39 is located adjacent to the source contact 41.

Figure 4:
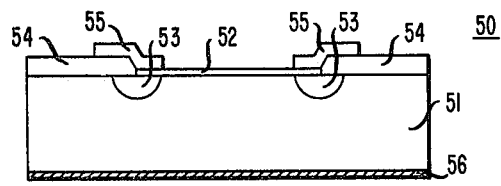
FIG. 4 shows a side view of a Schottky-barrier photodiode.

FIG. 4 shows a typical Schottky-barrier photodiode 50 composed of n-type silicon substrate 51 with a thin PtSi film (about 100 Angstroms) 52 and diffused guard ring 53. Insulator material 54 is also shown on each side of the photodiode as well as conductor material (usually Al) 55. An ohmic contact 56 is located at the bottom of the photodiode.

Figure 5:
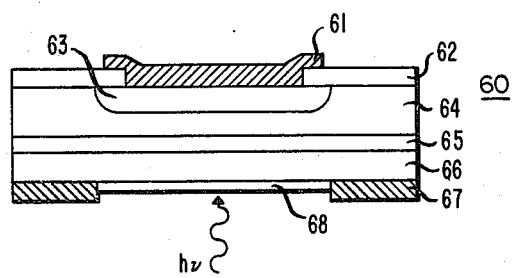
FIG. 5 shows a cross-section view of an indium phosphide photodiode.

FIG. 5 shows an indium phosphide photodetector 60 with top contact 61, dielectric 62 and p+ diffusion regions 63. Below the diffusion region, there is an n− InGaAs region 64, an n-InP buffer region 65 and an n-InP substrate 66. There is also a back contact 67 and an optical coating 68. Both the optical coating and the dielectric are advantageously made from borosilicate glass in accordance with the invention.

Borosilicate films are particularly advantageous in processes requiring temperatures in the range up to 900 degrees C. and where thermal expansion might be higher than about 1.5 parts per million per degree C. It is particularly advantageous for fabrication procedures involving InP, InGaAs and InGaAsP because some steps (i.e., diffusion doping using typically Cd, Zn, etc.) involve exposure of the semiconductor to temperatures up to 750 degrees C.

Typical procedures involve use of the borosilicate glass as a diffusion barrier or encapsulating layer. For example, a borosilicate layer is put down onto the semiconductor surface with areas of the semiconductor surface left uncovered so as to permit diffusion into the semiconductor. This may be done by a masking procedure or a photoresist procedure. Diffusion doping is then carried out and the doping confined to the areas where the surface was not covered by glass. Further processing might involve covering the uncovered area with glass film or even removal of the glass film on the surface.

Certain experiments were carried out using InP as the semiconductor material to test the effectiveness of borosilicate glass as an encapsulating agent and as a diffusion barrier up to 900 degrees C.

The deposition of the borosilicate glass films was performed in a commercially available r.f. sputtering unit. The technique used was similar to that described by Davidse and Maissel, Journal of Applied Physics 37, 574 (1966). The target material was prepared as follows: High purity (99.999%) $SiO_2$ and $B_2O_3$ were mixed in the proportions of 72% and 28% respectively by weight to form the composition $3SiO_2.B_2O_3$. After dry ball milling in a plastic jar using corundum balls for 15 hours, the mixture was sintered at about 1150 degrees C. for 6 hours and then quenched. The charge was next heated at about 1750 degrees C. for 12 hours using a $N_2(\frac{2}{3})$ $Ar(\simeq)$ mix in an r.f. heated furnace. The high temperature treatment ensures the uniformity of the glass, avoiding regions high in $SiO_2$ regions high in $SiO_2$ or $B_2O_3$. The material thus obtained was placed in a platinum mold of about 2.5" diameter and $\frac{3}{8}$" depth and heated to 1600 degrees C. for about 50 hours, after which it was furnace cooled. The thermal expansion coefficient of borosilicate glass of this composition is about 3.5 ppm/degrees C.

The substrates on which the borosilicate glass films were deposited consisted of <100> slices cut from either undoped or Sn-doped InP boules grown in the <111> direction using the liquid encapsulated Czochralski (LEC) pulling technique. The wafers were lapped and chemmechanically polished by using $Br_2$ in $CH_3OH$ solution. The substrate holder in the sputtering unit was water cooled and the sample was contacted to the holder with a heat sink compound. The distance between the substrate and target was about 6.5 cm. Argon was used as the sputtering gas with trace amounts of oxygen. The total pressure was kept at $5 \times 10^{-3}$ Torr. At an input power level of 250 W, films were deposited at a rate of 20 Angstroms per minute. Film thicknesses of 2500–3000 Angstroms were used.

To test the effectiveness of the borosilicate glass as an encapsulation agent on InP, a sample was polished on both sides but coated with borosilicate glass only on one side. The sample was then annealed in flowing helium at 700 degrees C. for 1 hour. The two surfaces of the annealed sample were examined microscopically. It was observed that the uncoated side had badly deteriorated, whereas the coated side showed no signs of cracking or peeling. After the borosilicate glass film was removed with buffered HF solution, the surface underneath it was found to be intact.

In another sample, which was coated with borosilicate glass on one side and annealed in flowing helium at 750 degrees C. for 1 hour, a sputter-Auger profile of the glass-InP interface region was obtained. The electron beam energy used was 6 keV. The sample was milled by a 2 keV $Ar^+$ beam with a 50 $\mu A/cm^2$ peak flux incident at 45 degrees with respect to the sample normal. The sputter rate for pure InP had been previously calibrated to be 110 Angstroms per minute for these beam conditions, and the indicated sputter rate for the glass is 3000 Angstroms/26.5 min=110 Angstroms per minute. The gradual increase in the In and P Auger signals is due to sputter induced roughening of the InP substrate. As the $Ar^+$ beam etches more deeply into the InP substrate, the effective surface area of the bombarded region increases due to the formation of steep-walled cones. Since the detected Auger intensity originates within about 20 Angstroms of the vacuum-solid interface, the In and P Auger signals increase with increasing surface area. The glass-InP interface width (estimated upper limit is about 200 Angstroms) is thus more accurately determined from the decrease of the Si and O signals. This interface-width determination is roughly the same as the expected depth resolution of ion milling for an interface buried 3000 Angstroms. Since there was little if any diffusion of InP into the glass, the borosilicate glass film is a very effective encapsulant for InP up to 750 degrees C.

In order to determine the effectiveness of borosilicate glass films as diffusion marks, an undoped n-type InP substrate having a carrier-concentration of about $5 \times 10^{16}$ cm$^3$, was polished to a mirror finish on both sides. The sample was coated on one side only with about 3000 Angstroms of borosilicate glass film and sealed in an evacuated quartz ampoule (volume about 10 cm$^3$) containing 0.5 mg and 1 mg of zinc and red phosphorus respectively. The ampoule was placed in a furnace and annealed at 650 degrees C. for one hour. After the diffusion anneal, the ampoule was cooled rapidly with a cold zone at one end to prevent condensation of diffusant vapors on the wafer. The sample was then cleaved so as to yield a smooth planar section parallel to the diffusion direction. One of these pieces was stained with $KOH + K_3Fe(CN)_6$ in aqueous solution to delineate the diffused junction. A micrograph of the cleaved and stained surface shows that a junction appears only in the uncoated side but not in the borosilicate glass-coated upper side. From these results it is concluded that borosilicate glass films are effective masks for diffusion of Zn up to 650 degrees C. and for background doping in the $5 \times 10^{16}/cm^3$ range.

For a passivating film to be satisfactory, it should be free from water dissolution, water pick up and component leaching. The films were tested for stability against moisture attack using infrared spectroscopy. For this purpose, a sample was polished on both sides and its absorption spectrum obtained in the range 200–4000 cm$^{-1}$. In the uncoated sample the only peaks observed in the absorption spectrum were those lying below 800 cm$^{-1}$, which are characteristic of InP. The sample was then coated with about 3000 Angstroms thick borosilicate glass film on one side and its absorption was recorded.

The two strong bands at 1070 cm$^{-1}$ and 1370 cm$^{-1}$ are attributed to Si-O stretching and B-O stretching respectively whereas the weaker bands at 800 cm$^{-1}$ and 920 cm$^{-1}$ are probably due to Si-O-B vibrations. The sample was then annealed at 700 degrees C. for one hour in flowing helium. Its absorption spectrum obtained after the annealing showed no change in the intensities of the absorption peaks lying above 800 cm$^{-1}$. Finally, the sample was boiled in water for about 6 hours. There was no change in the appearance and thickness of the film. The infrared absorption spectrum was again recorded and it showed essentially no change in the intensities of the B-O, or Si-O stretching absorption bands and no evidence of enhancement of the O-H band. The result indicates that none of the components of our films leached out after the harsh boiling water treatment.

These tests show the suitability of borosilicate glass as a mask diffusion barrier or encapsulating agent.

What is claimed is:

1. A process for fabricating a device including the step of sputtering a borosilicate glass target material on at least part of a surface to form a borosilicate glass layer, characterized in that the borosilicate glass target material used in the sputtering procedure is prepared by a procedure comprising the steps of:
   a. mixing together a substance A consisting essentially of SiO$_2$ with a substance B consisting essentially of B$_2$O$_3$; and
   b. heat treating the resulting mixture at a temperature between 1500 and 2100 degrees C. for at least six hours.

2. The process of claim 1 in which the mixing is done by ball milling for 5–15 hours.

3. The process of claim 1 in which at least 90 weight percent of the SiO$_2$ has particle size less than 10 microns and at least 90 weight percent of the B$_2$O$_3$ has particle size less than 10 microns.

4. The process of claim 1 in which the heat treatment is carried out between 1600 and 1900 degrees C. for 6 to 12 hours.

5. The process of claim 4 in which the heat treatment is carried out in an inert atmosphere.

6. The process of claim 5 in which the inert atmosphere consists essentially of nitrogen and argon.

7. The process of claim 1 in which a sintering procedure is carried out after mixing but before heat treatment, said sintering procedure comprising heating the mixture to between 1000 and 1300 degrees C. for one to 10 hours.

8. The process of claim 7 in which the sintering procedure is carried out at 1150 ±25 degrees C. for six hours.

9. The process of claim 1 in which the sputtering procedure is carried out with argon as the carrier gas.

10. The process of claim 9 in which the sputtering gas consists essentially of argon with trace amounts of oxygen.

11. The process of claim 1 in which the borosilicate glass target material consists essentially of up to 60 mole percent B$_2$O$_3$ remainder SiO$_2$.

12. The process of claim 11 in which the borosilicate glass target material consists essentially of 5–45 mole percent B$_2$O$_3$ remainder SiO$_2$.

13. The process of claim 1 in which the device is a semiconductor optical device and the borosilicate glass is sputtered on a surface consisting essentially of a III-V semiconductor.

14. The process of claim 13 in which the semiconductor compound is selected from the group consisting of gallium phosphide, silicon, indium phosphide, indium gallium arsenide, indium gallium arsenide phosphide, indium antimonide and germanium.

15. The process of claim 14 in which the semiconductor compound is selected from the group consisting of indium phosphide and indium gallium arsenide.

16. The process of claim 1 in which the process for fabricating a device includes a diffusion procedure carried out between 600 and 900 degrees C.

17. The process of claim 1 in which the borosilicate glass layer is used to encapsulate the device.

18. The process of claim 1 in which the resulting borosilicate glass target material is exposed to an annealing operation in the temperature range from 600 to 1400 degrees C. for one to 10 hours.

19. A device comprising a surface at least partially coated with a borosilicate glass layer, said layer fabricated by sputtering a borosilicate glass target material characterized in that the borosilicate glass target material used in the sputtering procedure is prepared by a procedure comprising the steps of
   a. mixing together a substance A consisting essentially of $SiO_2$ in which at least 90 weight percent of the $SiO_2$ has a particle size less than 10 microns with a substance B consisting essentially of $B_2O_3$ in which at least 90 weight percent of the $B_2O_3$ has a particle size less than 10 microns and
   b. heat treating the resulting mixture at a temperature between 1500 and 2100 degrees C. for at least 6 hours.

20. The device of claim 19 in which the mixing is done by ball milling for 5 to 15 hours.

21. The device of claim 19 in which the particle size is less than 1 micron.

22. The device of claim 19 in which the heat treatment is carried out between 1600 and 1900 degrees C. for 6 to 12 hours.

23. The device of claim 22 in which the heat treatment is carried out in an inert atmosphere.

24. The device of claim 23 in which the inert atmosphere consists essentially of nitrogen and argon.

25. The device of claim 19 in which a sintering procedure is carried out after mixing but before heat treatment, said sintering procedure comprising heating the mixture to between 1000 and 1300 degrees C. for 1 to 10 hours.

26. The device of claim 25 in which the sintering procedure is carried out at 1150 ±25 degrees C. for approximately 6 hours.

27. The device of claim 26 in which the sputtering procedure is carried out with argon as the carrier gas.

28. The device of claim 27 in which the sputtering gas consists essentially of argon with trace amounts of oxygen.

29. The device of claim 19 in which the borosilicate glass layer consists essentially of up to 60 mole percent $B_2O_3$ remainder $SiO_2$.

30. The device of claim 29 in which the borosilicate glass layer consists essentially of 5 to 45 mole percent $B_2O_3$ remainder $SiO_2$.

31. The device of claim 19 in which the borosilicate glass layer at least partially covers a surface consisting essentially of a III-V semiconductor.

32. The device of claim 19 in which the III-V semiconductor is selected from the group consisting of gallium phosphide, silicon, indium phosphide, indium gallium arsenide, indium gallium arsenide phosphide, indium antimonide and germanium.

33. The device of claim 19 in which the device is an optical semiconductor device.

34. The device of claim 19 in which the device is an optical laser.

35. The device of claim 19 in which the device is a light-emitting diode.

36. The device of claim 19 in which the device is an optical detector.

* * * * *